United States Patent [19]

Grischkowsky

[11] Patent Number: 4,922,091
[45] Date of Patent: May 1, 1990

[54] DIRECT GENERATION OF ULTRAFAST ELECTRICAL PULSES

[75] Inventor: Daniel R. Grischkowsky, Peekskill, N.Y.

[73] Assignee: International Business Machines Corporation, Armonk, N.Y.

[21] Appl. No.: 230,213

[22] Filed: Aug. 9, 1988

[51] Int. Cl.$^5$ ............................................. H01J 40/14
[52] U.S. Cl. ................................................ 250/211 J
[58] Field of Search ............... 250/211 R, 551; 370/2, 370/3, 4; 350/96.14; 357/30 R

[56] References Cited

U.S. PATENT DOCUMENTS 4,218,618  8/1980  Mourou ............................. 250/211 J Primary Examiner—David C. Nelms
Attorney, Agent, or Firm—Sughrue, Mion, Zinn, Macpeak & Seas

[57] ABSTRACT

A method of generating subpicosecond electrical pulses on a micron sized coplaner transmission line fabricated on an insulating, nonlinear optical substrate, by driving the line with focused ultrashort optical pulses. The pulses are generated directly on the transmission line by the optical rectification effect acting on the focal volume between the two lines of the transmission line of the focused ultrashort laser pulses. In the second embodiment, the transmission line is charged and the electrical pulse is generated by changing the capacitance in the focal volume between the two lines of the transmission line by the optical Kerr effect acting on the focused ultrashort optical pulses.

17 Claims, 1 Drawing Sheet

DIRECT GENERATION OF ULTRAFAST ELECTRICAL PULSES

BACKGROUND OF THE INVENTION

1. Field of Invention

This invention relates to the generation of signals in the terahertz frequency range and the detection thereof. In particular, this invention pertains to an ultrafast pulse generator usable for logic operation or as an oscillator or signal carrier for communications.

2. Prior Art

An important aspect of computer cycling speed is the time necessary for communication between logic circuitry and/or memory circuits on a particular chip. By increasing packing density and reducing the physical space between such elements, processing speeds may be increased by reducing the signal path length. A corresponding requirement to attain higher processing speeds is the need for timing circuits which operate at very high frequencies to provide stable clock pulses.

Reference is made to M. B. Ketchen, et al., "Generation of Subpicosecond Electrical Pulses on Coplaner Transmission Lines", Appl. Phys. Lett. 48 (12), 24 Mar. 1986, pp. 751–753. This publication describes techniques to generate ultrashort electrical pulses by photoconductively shorting charged transmission lines and narrow gaps. The technique photoconductively shorts the line by bridging using laser pulses as reported in that article, a transmission line having a design impedance of 100Ω was made using three parallel 5-$\mu$m wide aluminum lines which were separated from each other by 10-$\mu$m. That transmission line together with its contact pads was fabricated on an intrinsic silicon on sapphire (SOS) wafer. After fabrication, the wafer was heavily ion implanted to reduce the carrier lifetime. The transmission line was photoconductively shorted utilizing 80 fs laser pulses. The exciting beam had a spot diameter of 10-$\mu$m which bridged two of the three parallel transmission lines in a sliding contact arrangement. By utilizing a sampling beam coupled to a multichannel analyzer, subpicosecond electrical pulses were measured having an actual pulse width less than 0.6 ps.

While such demonstrated pulse speed is an improvement over existing technology, further gains are necessary. Specifically, since the laser excitation speed is in the order of 0.08 psec. it is possible to drive switches at higher rates consistent with the input laser switching time. Prior to this invention further gains in cycling speed have not been demonstrated.

SUMMARY OF THE INVENTION

Given this background, it is an object of this invention to provide a system that generates ultrashort electrical pulses which are independent of photoconductive carriers and thus independent of carrier lifetime.

It is a further object of this invention to define a method for the generation of ultrashort electrical pulses utilizing capacitive change techniques.

Yet another object of this invention is to directly generate ultrafast electrical pulses by employing optical rectification effects.

These and other objects of this invention are accomplished by utilizing two techniques for the generation of ultrashort electrical pulses, in both cases those pulses being independent of carriers and thereby of carrier lifetime.

In a first method, the electrical pulses are generated directly by the use of optical rectification effect (a $\chi^{(2)}$ process). By utilizing values as set forth in Auston et al, for the electro-optic material lithium tantalate, a 1 KW pulse focussed to 10$\mu$ diameter spot will produce an electric field of 10 v/cm across the 10-$\mu$m focal spot. In terms of geometry, this corresponds to 10 mv across the transmission line. Such a value is comparable to that reported in Ketchen et al, supra. Such a pulse would be coupled to the line and thus could be used for driving devices, providing timing pulses, optical sampling, and the like. This technique of electrical pulse generation provides important advantages over current methods which utilize photoconductivity. Photoconductivity is an operative process but, as discussed herein requires special preparation of a photoconductor and the switching speed is limited by the carrier lifetime. By this technique, such preparation is eliminated, yet higher speeds are achieved.

In the second method, by changing the effective capacitance on the transmission line in the spot illuminated by the laser, very short electrical pulses may be generated. This change is due to the non-linear response of the substrate. In both embodiments, a modified pattern from that illustrated in Ketchen et al. is employed. As illustrated in FIG. 1, only two transmission lines are employed. The lines are deposited on an insulating substrate with a dielectric constant that responds to the presence of light in the following manner:

$$\epsilon = \epsilon_0 + \epsilon_2 E^2$$

Utilizing this equation, $\epsilon_2$ describes the strength of the optical Kerr response. Then, consider a simplified situation for a capacitor filled with a dielectric characterized by the dielectric constant $\epsilon$. The charge Q on the capacitor is defined by:

$$Q = CV,$$

where, C is the capacitance and V is the voltage. For this simplified example, $$C = A\epsilon,$$

where A is a constant depending on the particular line geometry. It will now be shown that the operation of the device is independent of A.

Thus, if it is possible to change $\epsilon$ instantaneously, that is in a time very short when compared to the carrier transport, it is also possible to change V on the same time scale. Thus, assuming no charge transport, the change in V will be given by:

$$\delta V = \frac{-Q}{C^2} \delta C = \frac{-V\delta C}{C} = \frac{-V}{\epsilon} \delta \epsilon$$

Then, consider the following estimate for $\delta V$ utilizing $$\epsilon_2 \approx 10^{-11} \text{ esu.}$$

$\epsilon_0 = 2.5$ at light frequencies and $\epsilon_0 = 4$ at TeraHz frequencies, which are defined to be a reasonable assumption. Then, consider a 10 KW, 100 fsec pulse focussed to a 10-$\mu$m diameter spot. This will provide an intensity of 10 GW/cm$^2$ which corresponds to $E^2 = 5 \times 10^7$ in esu units. Thus, $\delta\epsilon$ is calculated to be $5 \times 10^{-4}$ and for an assumable V of 20 volts, $\delta V$ is 2.5 mV. As will be pointed out herein, this value can be derived. This invention will be described in greater detail referring to the drawing and the description of the preferred embodiments that follow.

DESCRIPTION OF THE PREFERRED EMBODIMENTS

Figure 1:
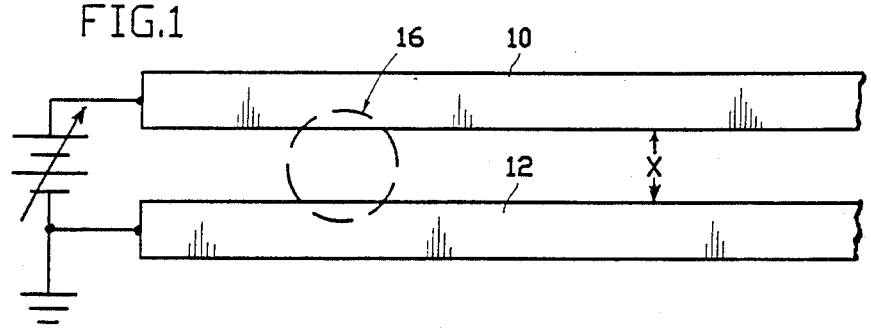
FIG. 1 is a plan view of a coplanar transmission line as utilized in the prior art to explain the operational method of this invention.
Figure 2:
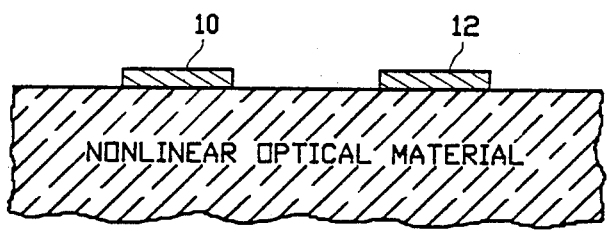
FIG. 2 is a schematic cross-sectional view of the wafer and transmission lines of FIG. 1.

Referring now to FIGS. 1 and 2, the transmission line used to generate ultrashort electrical pulses in accordance with this invention is depicted. The transmission line comprises two parallel 5 $\mu$m wide, 0.5 $\mu$m thick aluminum lines 10 and 12. The separation distance X is 10 $\mu$m. The design impedance for such a transmission line is approximately 100$\Omega$. For a length of approximately 20 mm the measured DC resistance of a single line 10 or 12 is 200$\Omega$.

The transmission line comprising lines 10 and 12 is fabricated on an electro-optic wafer (e.g. lithium tantalate or lithium niobate) illustrated in cross-section in FIG. 2.

In accordance with the first embodiment of this invention, the electrical pulses are generated directly utilizing the optical rectification effect. That is, the voltage across the transmission line is proportional to $\chi^{(2)}E^2$, where $\chi^{(2)}$ describes the strength of the optical rectification effect for the electro-optic material and E is the electric field strength of the focused laser pulses. By selection of appropriate values from Auston et al., "Cherenkov Radiation From Femtosecond Optical Pulses and Electro-Optic Media", Phys. Rev. Letters 53, 1555 (1984), a suitable electro-optic material was chosen to be lithium tantalate. A 1 KW pulse is focussed through a 10 $\mu$m diameter spot 16 illustrated in FIG. 1. The focal spot 16 will produce an electric field of 10 v/cm. Given the geometry of the transmission line of FIG. 1, such corresponds to 10 mV across the transmission line. That value is comparable to values reported in Ketchen et al., supra. This pulse is coupled to the transmission line and employed as required. For example, it can be employed to drive devices, provide timing pulses, for optical sampling or the like.

By employing optical rectification to generate fast voltage pulses, the effects of carrier relaxation are eliminated. This technique overcomes the limitations of utilizing photoconductive effects by eliminating the requirement of the use of a photoconductive layer and the preparation of a photoconductor. In addition, the pulse width is no longer limited by the carrier lifetime in the photoconductor.

Figure 3:
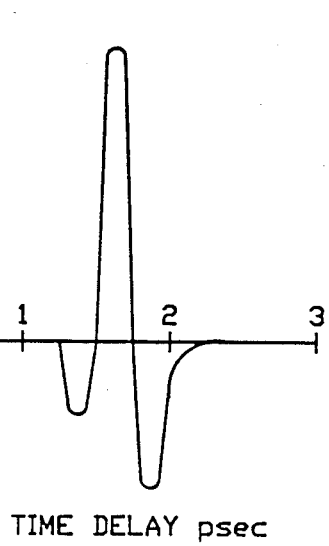
FIG. 3 is a graph illustrating the measured ultrashort pulse of this invention.

At a point on the transmission line downstream from the generation point, the generated electrical pulse is measured by standard optoelectronic sampling techniques applied to the coplanar transmission line geometry. These techniques include electro-optic sampling as described in the publication by J. A. Valdmanis, G. A. Mourou and C. W. Gabel, "Subpicosecond Electrical Sampling", in IEEE, J. Quantum Electronics, Vol. QE-19, 664 (1983), and sampling using photoconductive switches as described by Ketchen et al. The electro-optic technique can be directly applied to the electro-optic chip shown in FIG. 1, while for the photoconductive switches, the transmission line must be connected to the SOS measuring chip. An expected electrical pulse shape is shown in FIG. 3.

In accordance with the second embodiment of this invention, pulse generation is based on changing the effective capacitance on the transmission line in the spot 16 illuminated by the laser. The change is due to the non-linear optical Kerr effect response of the substrate, which in this embodiment is chosen to have a large optical Kerr effect. The transmission pattern of FIG. 1 is employed, the substrate an insulating material having a value of $\epsilon_2 \approx 10^{-11}$ esu. The substrate has a dielectric constant that responds to the presence of light in accordance with the following equation:

$$\epsilon = \epsilon_0 + \epsilon_2 E^2$$

where, $\epsilon$ is the dielectric constant, $\epsilon_0$ is the linear dielectric constant and $\epsilon_2$ is the strength of the optical Kerr response. Both lithium tantalate and lithium niobate may be used but would have to be driven harder.

Consider then, the situation where a capacitor is filled with a dielectric which may be characterized by the dielectric constant $\epsilon$. The charge Q on the capacitor is Q=CV where C is the capacitance and V is the voltage across the two lines of the transmission line. In this simplified example, C=A$\epsilon$, where A is a constant dependent on the particular embodiment. It will be shown that the operation of the device is independent of A. Thus, if $\epsilon$ can be changed instantaneously, that is in a time very short when compared to the carrier transport, the change in voltage can be accomplished in the same time scale.

Thus, assuming no charge transport, the change in V will be $$\delta V = \frac{-Q}{C^2} \delta C = \frac{-V\delta C}{C} = \frac{-V}{\epsilon} \delta \epsilon$$

The value of $\delta V$ using $\epsilon_2 \approx 10^{-11}$ esu, $\epsilon_0 = 2.5$ at light frequencies and $\epsilon_0 = 4$ at TeraHz frequencies is a value that can be obtained by this invention.

Next, consider a 10 KW, 100 fsec pulse focussed to a 10-$\mu$m diameter spot across the transmission line. This yields an intensity of 10 GW/cm$^2$ corresponding to $E^2 = 5 \times 10^7$ when taken in esu units. Thus, $\delta \epsilon$ is calculated to be $5 \times 10^{-4}$. For a value of V of 20 volts, $\delta V$ is 2.5 mV. It can be appreciated that this value can be observed and thus very fast voltage pulses can be generated compared to those techniques which employ photoconductivity.

Many materials are suitable for use as the substrate exhibiting an optical Kerr effect are listed in T. Y. Chang, "Optical Engineering", 20, p. 220, (1981). Examples include lithium tantalate, lithium niobate, and undoped GaAs. Of those, GaAs exhibits a large optical Kerr effect. Generally, the wavelength of the driving light pulse must be longer than that corresponding to the bandgap of the substrate in order to not generate photocarriers.

It is apparent that changes may be practiced without departing from the scope of this invention.

Having described my invention, I claim:

1. A method of generating a subpicosecond electrical pulse comprising the steps of:

providing a transmission line on a substrate of an electro-optic material; and focussing a laser pulse across said transmission line to generate a subpicosecond electrical pulse directly on the transmission line by an optical rectification effect exhibited by said substrate which is coupled to said transmission line to produce said electrical pulse.

2. The method of claim 1, wherein said laser pulse is focussed to produce a spot approximately equal to the line separation in said transmission line.

3. The method of claim 1, wherein said electrical pulse produced by said optical rectification effect has an electric field in the range of 10 V/cm.

4. The method of claim 1, wherein said optical rectification effect causes a pulse of voltage whose magnitude is proportional to the intensity of said laser pulse, and whose pulse duration is approximately the same as that of said laser pulse.

5. The method of claim 1 further comprising the step of optically sampling said transmission line to sense said subpicosecond pulse.

6. The method of claim 1 wherein said laser pulse is focussed to produce a spot having a diameter in the range of 10 $\mu$m.

7. The method of claim 4, wherein lithium tantalate is the electro-optic material used, which shows the optical rectification effect.

8. The method of claim 4, wherein lithium niobate is the electro-optic material used, which shows the optical rectification effect.

9. A method of generating a subpicosecond electrical pulse comprising the steps of:

providing a transmission line having a pair of conductive lines on an insulating substrate having an optical Kerr effect; and focussing a laser pulse across said transmission line to change the effective capacitance of said substrate in the volume of material defined by the laser focal spot across said transmission line and thereby create a subpicosecond pulse on said transmission line.

10. The method of claim 9, wherein said substrate has a dielectric constant of $$\epsilon = \epsilon_0 + \epsilon_2 E^2$$

where $\epsilon_0$ is linear value of said substrate dielectric constant and $\epsilon_2 E^2$ is the field effect produced by incident laser light.

11. The method of claim 9, wherein said change in dielectric constant of said substrate occurs in a time very short compared to the carrier transport through said substrate.

12. The method of claim 9, wherein said laser pulse is a 10 KW, 100 fsec pulse focussed to a 10-$\mu$m diameter spot on said transmission line.

13. The method of claim 9, wherein lithium tantalate is the electro-optic material used, which shows an optical Kerr effect.

14. The method of claim 9, wherein lithium niobate is the electro-optic material used, which shows an optical Kerr effect.

15. The method of claim 9 further comprising the steps of optically sampling said transmission line to sense said subpicosecond pulse.

16. The method of claim 9, where said substrate is GaAs.

17. The method of claim 9, where said laser pulse has a wavelength longer that that corresponding to the bandgap of said substrate.

* * * * *